US006160460A

United States Patent [19]

Hicks et al.

[11] Patent Number: 6,160,460

[45] **Date of Patent: *Dec. 12, 2000**

[54] SELF-TUNING RESONANT CAVITY FILTER

[75] Inventors: John R. Hicks, Lone Oak; David W. Allen, Plano; Peter Mailandt, Dallas, all of Tex.

[73] Assignee: Allen Telecom Inc., Beachwood, Ohio

[ * ] Notice: This patent is subject to a terminal disclaimer.

[21] Appl. No.: 09/059,489

[22] Filed: Apr. 13, 1998

Related U.S. Application Data

[63] Continuation of application No. 08/183,054, Jan. 18, 1994, Pat. No. 5,739,731.

[51] Int. Cl.[7] .............................. H03J 5/02; H04B 3/04; H01P 1/213; H01P 7/06; H01P 7/10

[52] U.S. Cl. ......................... 333/17.1; 333/134; 333/202; 333/219.1; 333/232; 333/235; 455/123; 455/125

[58] Field of Search .................................... 333/17.1, 231, 333/202, 205, 219, 219.1, 221, 227, 230, 232, 235, 2, 134; 455/120, 123, 124, 125

[56] References Cited

U.S. PATENT DOCUMENTS

| | | | |
|---|---|---|---|
| 3,165,697 | 1/1965 | Reich et al. | 325/127 |
| 3,715,690 | 2/1973 | Young et al. | 333/17.1 |
| 3,800,230 | 3/1974 | Marks et al. | 325/396 |
| 4,157,515 | 6/1979 | de Bayser et al. | 333/17 |
| 4,272,743 | 6/1981 | Evans | 333/176 |
| 4,343,001 | 8/1982 | Anderson et al. | 343/745 |
| 4,700,146 | 10/1987 | Barton | 331/7 |
| 4,726,071 | 2/1988 | Jachowski | 455/125 |
| 4,958,163 | 9/1990 | Leonard | 343/745 |
| 5,235,294 | 8/1993 | Ishikawa et al. | 333/235 X |

FOREIGN PATENT DOCUMENTS

| | | |
|---|---|---|
| 12656 | 6/1980 | European Pat. Off. . |
| 4-336801 | 11/1992 | Japan . |

*Primary Examiner*—Benny Lee
*Assistant Examiner*—Barbara Summons
*Attorney, Agent, or Firm*—Laff, Whitesel & Saret

[57] ABSTRACT

In one form of the invention, a resonant cavity filter (50) is disclosed, comprising an input port (210) for receiving an input signal, a dielectric resonator (204) in a cavity, the dielectric resonator operable to receive an input signal from the input port and further operable to produce an output signal at a resonant frequency of the cavity, an output port (212) operable to receive the output signal and a tuning plate (308) disposed in the cavity, the tuning plate coupled to a control means operable to cause movement of the tuning plate, thereby changing dimensions of the cavity, the control means operable to determine a frequency of the input signal, retrieve an expected tuning plate position from a memory (514) based on the frequency, and move the tuning plate to the expected position. Other systems, devices and methods are disclosed.

17 Claims, 14 Drawing Sheets

SELF-TUNING RESONANT CAVITY FILTER

CROSS-REFERENCES TO RELATED APPLICATIONS

This application is a continuation of application Ser. No. 08/183,054, filed on Jan. 18, 1994, now U.S. Pat. No. 5,739,731, which is incorporated herein by reference.

TECHNICAL FIELD OF THE INVENTION

The present invention relates generally to resonant cavity filters, and more particularly to self-tuning resonant cavity filters.

BACKGROUND OF THE INVENTION

Resonant cavity filters are used in many high frequency (RF and microwave) electronic applications. For example, in cellular telephone communications, users within each operating cell are assigned a unique operating frequency within the frequency band designated for cellular communications. Therefore, each time a cellular user places or receives a call, that call will be assigned to one of hundreds of allocated frequencies. The transmitter channel in the cell repeater station that is relaying the telephone call must be tuned to the specific frequency of the call. A typical cellular communications frequency band spans 869 MHz–894 MHz, with channel frequencies spaced 630 kHz apart (Advanced Mobile Phone Service (AMPS) frequency standard). The cellular telephone service provider will assign particular channel frequencies to different cell sites within its service area. For example, a typical cell site may have 24 channel frequencies assigned to it. Each of these channels has a repeater transmitter that operates at the channel frequency.

Typically, each channel in the cell station has a dielectric resonant filter at the transmitter's RF output that must be tuned to the channel frequency. This narrow bandpass filter ensures that only the frequency assigned to that channel is transmitted. FIG. 1 schematically illustrates such a prior art resonant cavity filter, indicated generally at 10. Filter 10 comprises a cavity enclosure 12 substantially surrounding a dielectric resonator 14. Dielectric resonator 14 is typically composed of barium tetratianate ($BaT_{14}O_9$). An input signal from the channel transmitter is received on the input to the cavity via conductor 16, terminal 17 and tuning loop 18. It is the function of the resonant cavity filter 10 to form a bandpass which attenuates all signals except the assigned channel frequency. The resonant frequency of the filter 10 is changed by increasing or decreasing the effective volume of cavity 12. This volume change is affected by varying the position of a tuning plate 20. Tuning plate 20 is moved coaxially within the cavity 12 by means of an adjustment screw 22 coupled to a tuning shaft 24, which is in turn coupled to tuning plate 20. Rotation of the adjustment screw 22 moves tuning shaft 24 into or out of the cavity 12, depending upon the direction of rotation of the adjustment screw 22. Dielectric resonator 14 is excited by the RF input signal emanating from tuning loop 18 and this causes resonator 14 to vibrate. However, resonator 14 will vibrate substantially only at a resonant frequency determined by the physical dimensions of the cavity 12. The resulting filtered output is coupled by tuning loop 28 and therefore consists mainly of the resonant frequency component of the RF input signal. Tuning loop 28 is coupled to terminal 29 and conductor 30.

There are certain situations where the cellular service provider would like to reallocate channel frequencies temporarily from one cell to another. For example, when a large number of people congregate in one place, such as at a sporting event, a very large number of cellular users are placed into one cell site. The number of channel frequencies assigned to that cell site may very well be inadequate to handle the increased demand for channels. In this situation, the cellular service provider will want to temporarily reassign channel frequencies from other cell sites. Present technology enables the channel transmitters to be tuned to particular frequencies under remote control (such as through a telephone line), however, the resonant cavity filters 10 of each new channel must be manually tuned to the new frequency. This manual operation is both time consuming and expensive. During manual tuning, the tuning plate 20 must be moved until the effective volume of the cavity 12 is such that the dielectric resonator 14 resonates at the channel frequency and therefore only the assigned frequency will pass through filter 10. To do this, the reflected power at the input terminal 17 is measured. When the resonant cavity filter 10 is properly tuned, the reflected power at input terminal 17 will be at a minimum. Therefore, the tuning sequence begins with the operator rotating the adjustment screw 22 to move the tuning plate 20 in a first direction. If the reflected power at input terminal 17 increases, the operator moves the tuning plate 20 in the opposite direction. If, on the other hand, the reflected power at input terminal 17 decreases, the operator continues to rotate the adjustment screw 22 to move the tuning plate 20 in the same direction until the reflected power ceases to decrease. At this point, the reflected power is at a minimum and the resonant cavity 10 is therefore tuned to the channel frequency (the frequency of the channel transmitter).

The prior art resonant cavity filter 10 of FIG. 1 has a major problem. A human operator must adjust the resonant frequency of each newly assigned channel at the cell site even though the frequency of the channel transmitter can be changed from a remote location. It can take quite awhile for the operator to perform this operation because he must move the tuning plate 20 back and forth in small steps over a potentially great distance in order to discover the minimum reflected energy. If the newly assigned channel is using a frequency much higher or much lower than the previously used frequency, the tuning plate must be moved relatively far within the cavity 12 while searching for the minimum frequency. This process involves moving the tuning plate 20 a predetermined step size, measuring the reflected power, and determining if the newly measured reflected power is greater than or less than the previously measured reflected power for every step increment. The smaller the predetermined step size, the more accurately tunable is the filter 10. Therefore, a precise resonant cavity filter 10 can take quite a while to determine the optimum tuning position of the tuning plate 20.

Accordingly, a self-tuning resonant cavity filter which overcomes any or all of these problems is highly desirable. The present invention is directed toward meeting these needs.

SUMMARY OF THE INVENTION

It is therefore the object of the present invention to provide a self-tuning resonant cavity filter which can be tuned very quickly.

To overcome the problems inherent in the prior art devices, the present invention incorporates a novel control system. The control system contains a frequency counter coupled to the RF input which measures the input frequency and communicates this value to an associated microprocessor. The microprocessor uses this measured frequency value to index a look-up table in an associated read-only memory (ROM). The value returned by the look-up table indicates the expected tuning plate position corresponding to this input frequency. The look-up table information is characterized for the particular filter cavity and placed in the ROM during manufacture. The tuning plate is moved very rapidly to the designated position, at which point the control system quickly finds the minimum reflected power. If the minimum reflected power is not at the expected tuning plate location, the data in the look-up table is updated, thereby automatically adapting for wear in the mechanical components of the system.

The improvements of the present invention have the advantages that the resonant cavity filter will tune itself automatically to any frequency presented to its input and that tuning time of the resonant cavity filter is improved by moving the tuning plate to the expected tuned location prior to actually employing the tuning process.

In one form of the invention, a method for characterizing a frequency response of a resonant cavity filter is disclosed, comprising the steps of (a) inputting a first frequency signal to the resonant cavity filter, (b) changing dimensions of the resonant cavity until the resonant cavity resonates at the first frequency, (c) storing information relating to the dimensions of the resonant cavity which cause the resonant cavity to resonate at the first frequency and (d) repeating steps (a), (b) and (c) for each frequency at which it is desired to know the frequency response of the resonant cavity filter.

In another form of the invention, a method for characterizing a frequency response of a resonant cavity filter is disclosed, comprising the steps of (a) inputting a first frequency signal to the resonant cavity filter at an input, (b) measuring an amount of the first frequency signal reflected by the input, (c) changing dimensions of the resonant cavity until the reflected amount is at a minimum, (d) storing information relating to the dimensions of the resonant cavity which result in the minimum reflected amount and (e) repeating steps (a), (b), (c) and (d) for each frequency at which it is desired to know the frequency response of the resonant cavity filter.

In another form of the invention, a method for tuning a resonant cavity filter is disclosed, comprising the steps of (a) inputting a signal to the resonant cavity filter at an input, (b) measuring a frequency of the signal, (c) using the frequency information to index a lookup table stored in memory, the lookup table returning an expected location of a tuning plate within the resonant cavity which will produce resonance and (d) moving the tuning plate to the expected location.

In another form of the invention, a method of operating a microprocessor controlled device having a memory is disclosed, comprising the steps of (a) storing information relating to manufacture of the device in the memory at a time of manufacture and (b) storing information relating to operating conditions of the device in the memory during operation of the device.

In another form of the invention, a resonant cavity filter is disclosed, comprising an input port for receiving an input signal, a dielectric resonator in a cavity, the dielectric resonator operable to receive an input signal from the input port and further operable to produce an output signal at a resonant frequency of the cavity, an output port operable to receive the output signal and a tuning plate disposed in the cavity, the tuning plate coupled to a control means operable to cause movement of the tuning plate, thereby changing dimensions of the cavity, the control means operable to characterize a frequency response of the resonant cavity filter and store frequency response data, the data to be used by the control means when tuning the resonant cavity filter.

In another form of the invention, a resonant cavity filter is disclosed, comprising an input port for receiving an input signal, a dielectric resonator in a cavity, the dielectric resonator operable to receive an input signal from the input port and further operable to produce an output signal at a resonant frequency of the cavity, an output port operable to receive the output signal and a tuning plate disposed in the cavity, the tuning plate coupled to a control means operable to cause movement of the tuning plate, thereby changing dimensions of the cavity, the control means operable to determine a frequency of the input signal, retrieve an expected tuning plate position from a memory based on the frequency, and move the tuning plate to the expected position.

Finally, in another form of the invention, a device is disclosed, comprising a microprocessor and memory means, wherein the microprocessor is operable to store information relating to manufacture of the device in the memory at a time of manufacture and further operable to store information relating to operating conditions of the device in the memory during operation of the device.

BRIEF DESCRIPTION OF THE DRAWINGS

The novel features believed to be characteristic of the invention are set forth in the appended claims. For a more complete understanding of the present invention, and for further details and advantages thereof, reference is now made to the following Detailed Description taken in conjunction with the accompanying drawings, in which:

FIGS. 7, 7A and 7B are a schematic diagram of a first embodiment of a control board of the present invention;

It is to be expressly understood, however, that the drawings are for purposes of illustration only and are not intended as a definition of the limits of the invention. Such definition is made only by the appended claims.

DETAILED DESCRIPTION OF THE DRAWINGS

Figure 1:
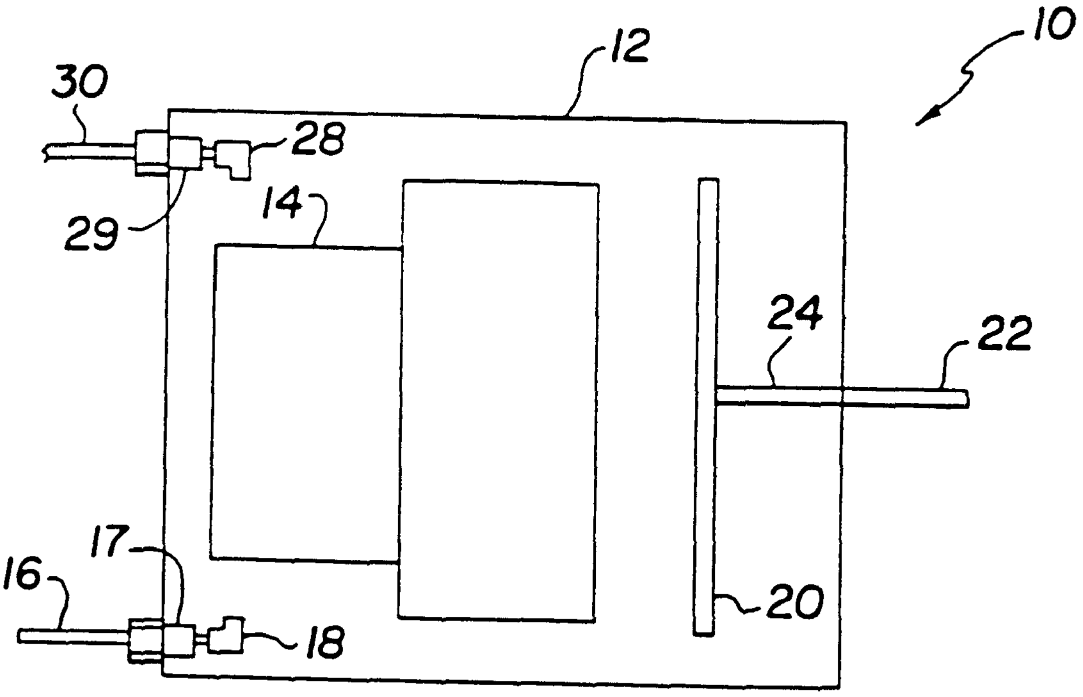
Fig. 1 (PRIOR ART)
FIG. 1 is a schematic diagram of a prior art resonant cavity filter.
Figure 2:
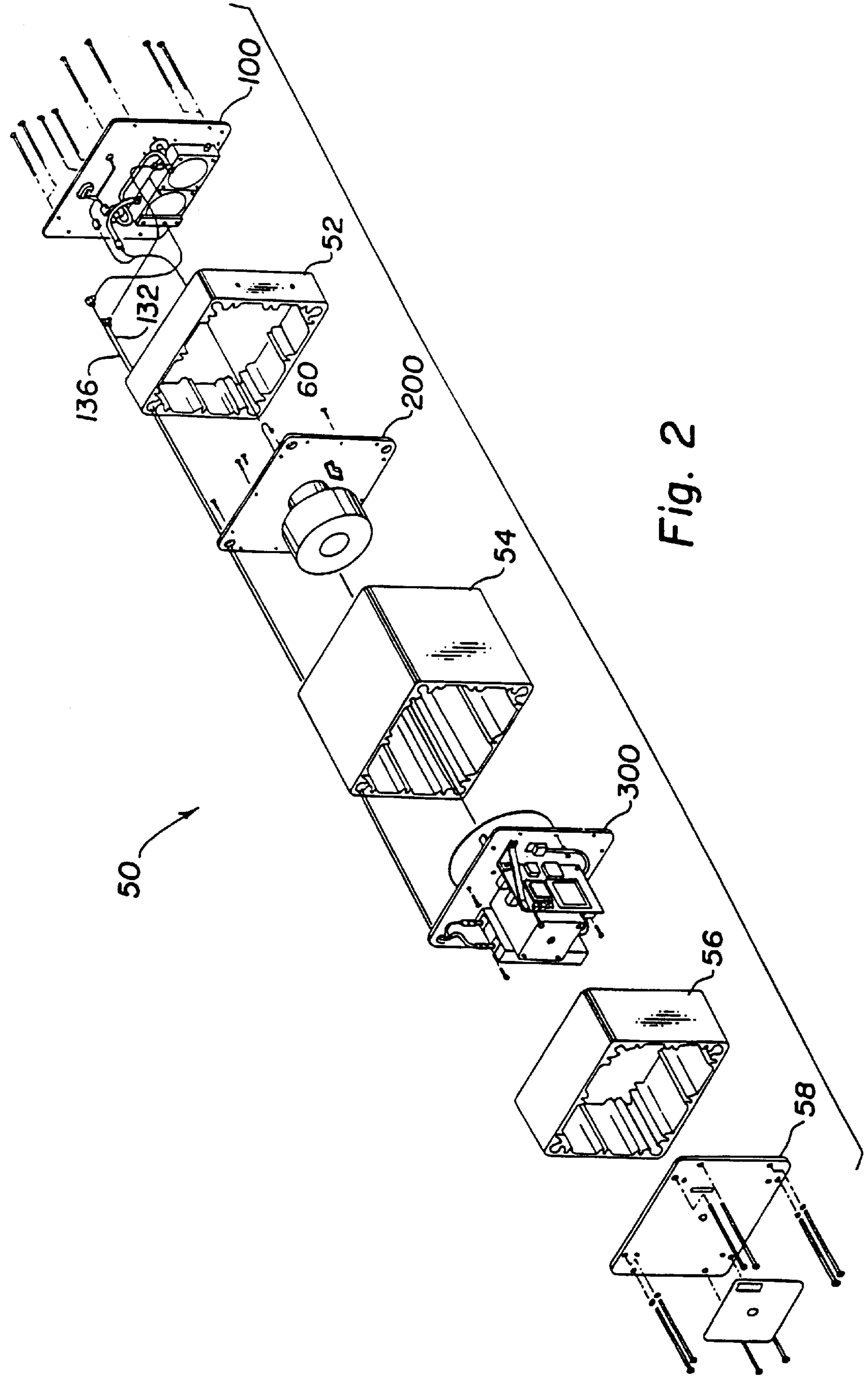
FIG. 2 is an exploded isometric view of a first embodiment of the present invention.

The present invention relates to a self-tuning resonant cavity filter with an improved self-tuning procedure. Referring to FIG. 2, there is illustrated an exploded isometric view of a first embodiment of the present invention indicated generally at 50. An RF isolator assembly 100 forms the rear physical panel of the first embodiment of the present invention and has suitable couplings (not shown) for input of an RF signal and output of a bandpass filtered version of the input signal. The isolator board 100 provides a 50 Ohm interface between the input and output connectors and the resonant cavity filter 50. Also shown is a dielectric resonator assembly 200 which is mechanically joined to the isolator assembly 100 by means of enclosure section 52. Dielectric resonator assembly 200 receives the input RF signal but produces an output RF signal consisting of only the selected frequency component of the original RF input signal. This is a consequence of the fact that the resonator resonates at only a single selected frequency. This RF output signal is sent to the RF output connector through isolator assembly 100. The dielectric resonator assembly 200 is mechanically joined to an RF/control assembly 300 by means of enclosure section 54. The resonant cavity of the dielectric resonator is therefore formed by the dielectric resonator board 200, the enclosure section 54 and the RF/control board 300. The effective dimensions of this resonant cavity may be dynamically altered as will be described hereinbelow. The enclosure of the self-tuning resonant cavity filter 50 is completed by enclosure section 56, which attaches to RF/control board 300, and by end plate 58. A temperature sensor 60 is mounted to the rear of dielectric resonator board 200. The output of temperature sensor 60 is routed through board 200, enclosure section 54 and RF/control board 300 to RF board 400 (not shown, see FIG. 6).

Figure 3:
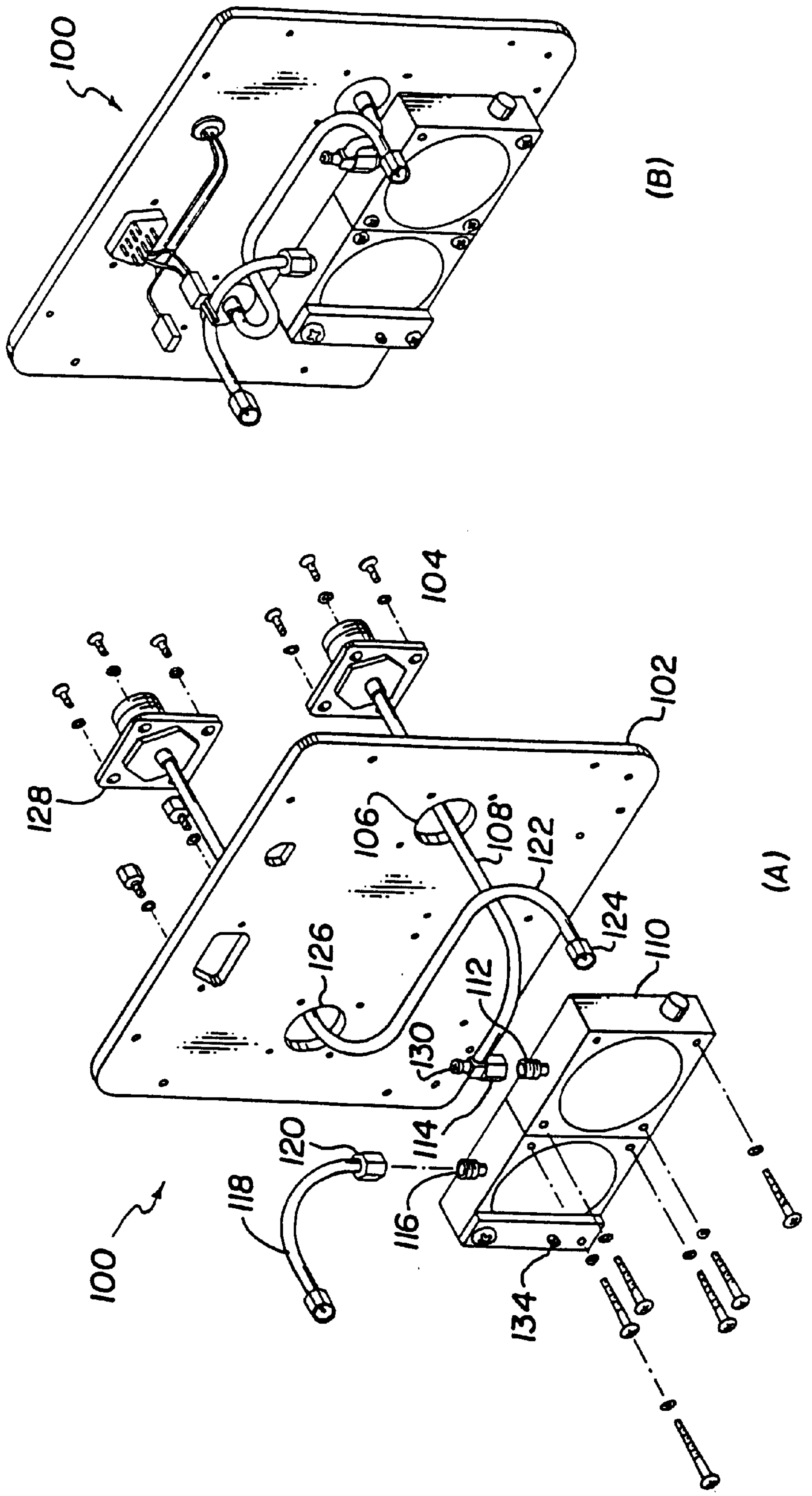
FIGS. 3A & 3B are, respectively, an exploded isometric view and an isometric view of a first embodiment of an isolator board of the present invention.

Referring now to FIG. 3A, there is illustrated an exploded isometric view of a first embodiment of the isolator board of the present invention, indicated generally at 100. The various components of the isolator board 100 are mounted on board 102 which forms a mechanical support for the components of isolator board 100 as well as the rear end panel of the enclosure of self-tuning resonant cavity filter 50. Board 102 may be any suitable rigid material, such as aluminum. RF input connector 104 is mounted on the rear of board 102. Such placement results in RF input connector 104 being on the outside of the rear end panel of resonant cavity filter 50 once assembled. RF input connector may be any suitable RF connector, such as the type commonly known as APC-7. Any signal applied to RF input connector 104 is brought through board 102 by means of hole 106 and coaxial RF cable 108. The RF input signal is applied to isolator 110 at its input port 112 by means of connector 114. Connector 114 is preferably of the type commonly known as SMA. Isolator 110 may be any suitable 50 Ohm RF isolator, such as those manufactured by Ocean Microwave. Isolator 110 is mechanically mounted to the opposite side of board 110 from RF input connector 104. The output of isolator 110 is taken from output port 116 by means of cable 118 having a suitable connector 120 preferably of the type known as SMA. Referring briefly once more to FIG. 2, it can be seen that cable 118 is coupled to dielectric resonator board 200 as will be described in more detail hereinbelow. Referring now to FIG. 3A once more, the filtered output RF signal from dielectric resonator board 200 is coupled to cable 122 by means of SMA connector 124. Cable 122 passes through board 102 by means of hole 126 and is connected to APC-7 RF output connector 128. RF output connector 128 is mounted to the same side of board 102 as RF input connector 104, therefore RF output connector 128 will also be on the outside of resonant cavity filter 50 when assembled.

Connector 130 is provided to allow measurement of the power level of the RF input signal applied to connector 104. Referring briefly once more to FIG. 2, it can be seen that connector 130 is coupled by means of cable 132 which passes through enclosure section 52, dielectric resonator board 200, enclosure section 54, RF/control board 300 and finally terminates at RF/control board 300 as will be described in more detail hereinbelow. Similarly, as shown in FIG. 3A, isolator 110 includes an internal transformer (not shown) which allows for measurement of the RF power reflected by the dielectric resonator board 200. Connection to this transformer is made at connector 134. Referring briefly once more to FIG. 2, it can be seen that connector 134 is coupled by means of cable 136 which passes through enclosure section 52, dielectric resonator board 200, enclosure section 54, RF/control board 300 and finally terminates at RF/control board 300 as will be described in more detail hereinbelow.

Referring now to FIG. 3B, there is shown an isometric view of the assembled isolator board 100. Isolator board 100 additionally forms the rear end plate of the enclosure of resonant cavity filter 50.

Figure 4:
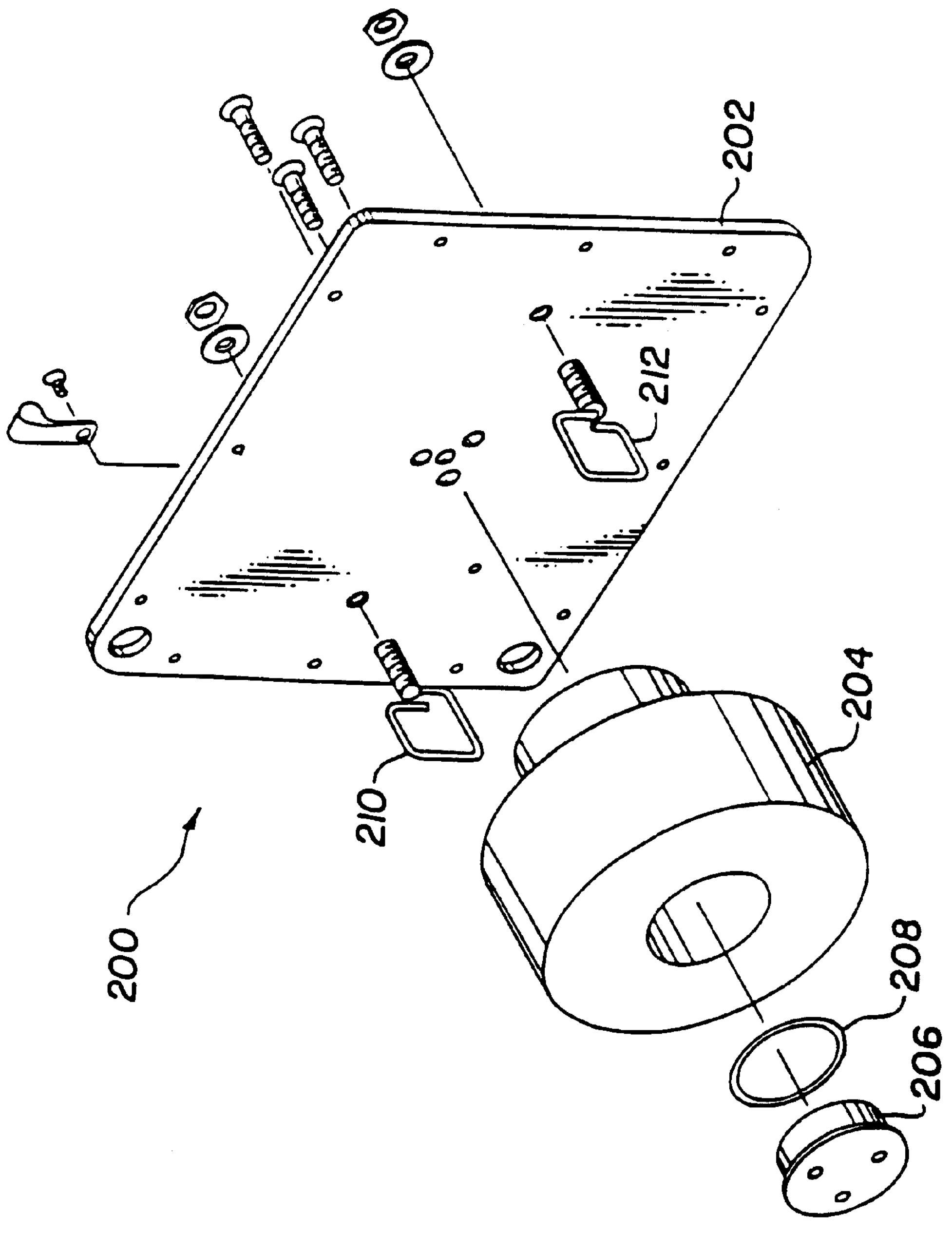
FIG. 4 is an exploded isometric view of a first embodiment of a dielectric resonator board of the present invention.

Referring now to FIG. 4, there is illustrated an exploded isometric view of a first embodiment of a dielectric resonator board of the present invention, indicated generally at 200. A board 202 is provided for mechanical support of the other components of the dielectric resonator board 200, as well as for defining one end of the resonant cavity, and is preferably made of aluminum. A dielectric resonator 204 is mounted to board 202 by means of a plug 206 and gasket 208. Dielectric resonator 204 is preferably made from barium tetratianate. Input tuning loop 210 is mounted to board 202 adjacent dielectric resonator 204 and is adapted to receive cable 118 from isolator board 100 (see FIGS. 3A & 3B). Output tuning loop 212 is also mounted to board 202 adjacent dielectric resonator 204, but on the opposite side of dielectric resonator 204 from input tuning loop 210. Furthermore, output tuning loop 212 is oriented 180 degrees from the orientation of input tuning loop 210. In operation, the isolated RF input signal is supplied to input tuning loop 210 via cable 118 and causes input tuning loop 210 to radiate the RF input signal into the resonant cavity. The dielectric resonator 204 absorbs this radiated RF input energy and begins to resonate at a frequency determined largely by the physical dimensions of the resonant cavity in which the dielectric resonator 204 is situated. This resonant cavity is defined by the board 202, the enclosure section 54 and the RF/control board 300. The effective size of this resonant cavity may be altered by the resonant cavity filter as described in more detail hereinbelow. Altering the size of the resonant cavity will operate to change the resonant frequency of the dielectric resonator 204. As a consequence of the physical properties of the dielectric resonator 204, it will absorb the full spectrum of RF input frequencies radiated by input tuning loop 210, but the dielectric resonator 204 will substantially only radiate RF energy at the frequency of its resonant vibration (actually over a narrow band centered on its resonant frequency). This energy radiated by the dielectric resonator 204 is coupled by output tuning loop 212 to cable 122 and thereby to RF output connector 128. Hence, by altering the effective size of the resonant cavity, the RF input signal can be bandpass filtered with a narrow (high Q)

bandpass centered on any frequency within the resonant cavity's operating band.

Figure 5:
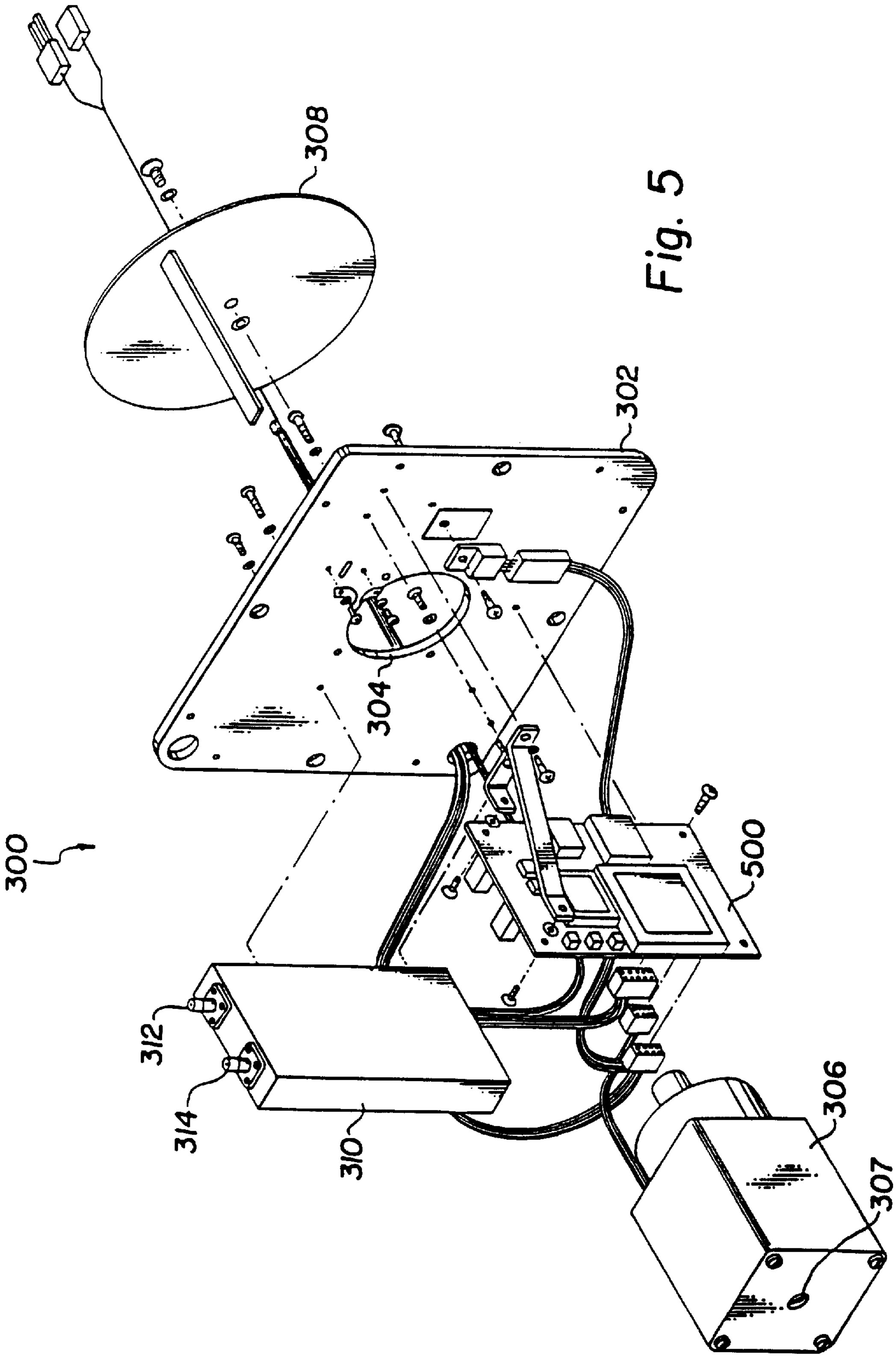
FIG. 5 is an exploded isometric view of a first embodiment of an RF/control board of the present invention.

Referring now to FIG. 5, there is illustrated an exploded isometric view of a first embodiment of an RF/control board of the present invention, indicated generally at 300. RF/control board 300 includes a board 302, preferably made of aluminum. Mounted to a first side of board 302 and extending through hole 304 is linear actuator device 306. Linear actuator 306 includes a stepper motor (not shown) coupled to a lead screw (not shown). This allows the precisely controllable rotational movement of the stepper motor to be converted into precisely controllable linear motion of any object attached to the lead screw. The linear actuator 306 is preferably controlled in an automatic manner, which is described in detail hereinbelow, but may also be operated in a manual manner by use of tuning screw 307. A tuning plate 308 is positioned on a second side of board 302 and coupled to the lead screw of linear actuator 306. Because the board 302 defines one end of the resonant cavity, the tuning plate 308 is within the resonant cavity. Because the tuning plate has a diameter approaching the width of board 302, tuning plate 308 effectively acts as the defining end of the resonant cavity. Therefore, operation of the linear actuator 306 causes the tuning plate 308 to move toward or away from dielectric resonator 204, thereby respectively increasing or decreasing the resonant frequency of dielectric resonator 204. Also mounted on board 302 is an RF board 400 (not shown, see FIG. 6) enclosed within shielded package 310. A connector 312 is mounted on shielded package 310 in order to couple the sampled RF input signal on cable 132 to the RF board 400. Likewise, connector 314 is mounted on shielded package 310 in order to couple the reflected RF input signal on cable 136 to the RF board 400. The RF board 400 is described in more detail hereinbelow with reference to FIG. 6. Additionally mounted on board 302 is control board 500. Control board 500 is described in more detail hereinbelow with reference to FIG. 7.

Figure 6:
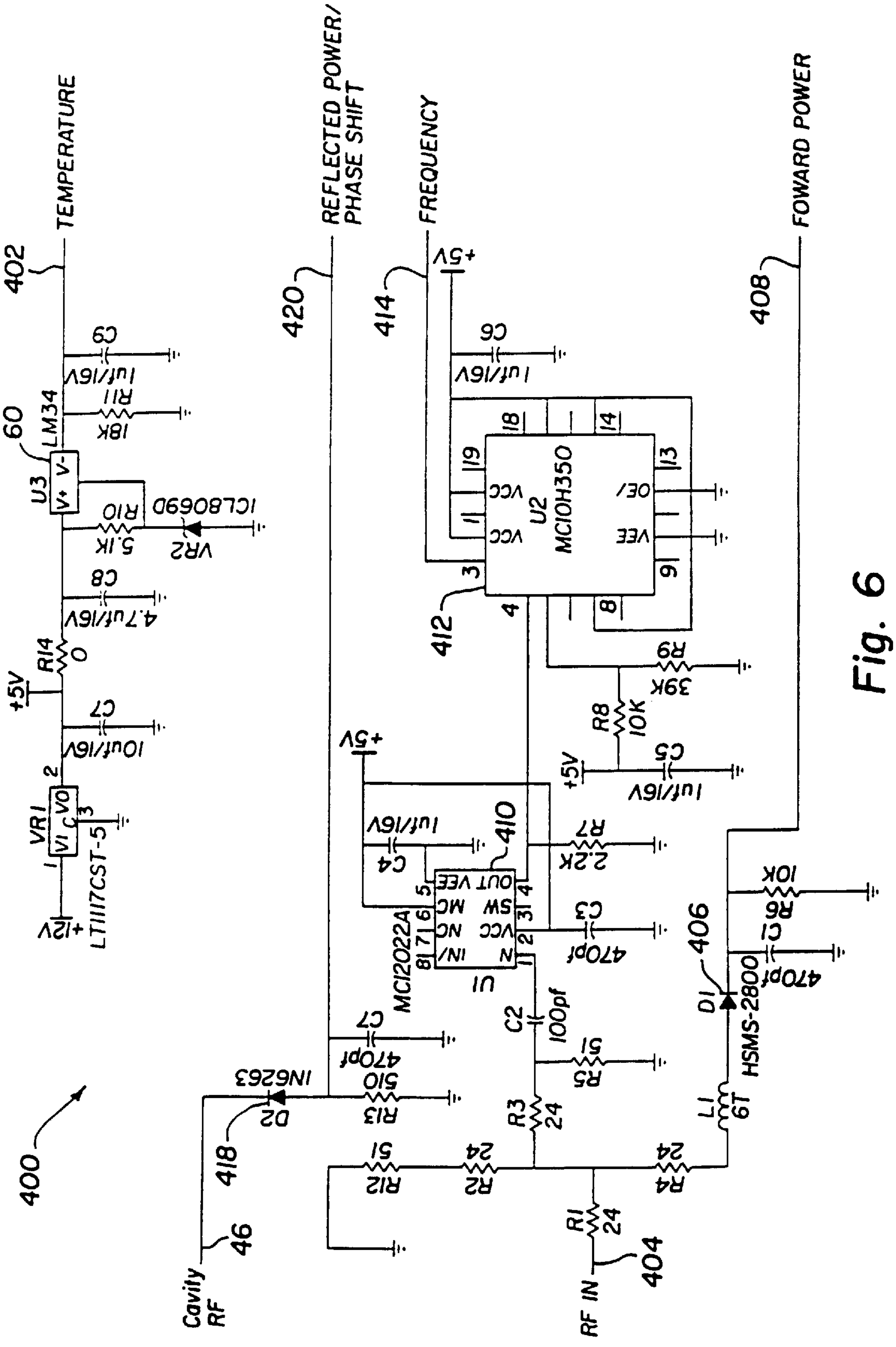
FIG. 6 is a schematic diagram of a first embodiment of an RF board of the present invention.

Referring now to FIG. 6, there is illustrated a schematic diagram of a first embodiment of the RF board 400 of the present invention. Temperature sensor 60 is shown in the schematic, but it is actually located remotely from the RF board 400 (see FIG. 2 and related discussion). The output of temperature sensor 60 is coupled to associated support circuitry as indicated in FIG. 6 and produces a voltage at output 402 which is proportional to the temperature near dielectric resonator 204. Output 402 is routed to input 502 of control board 500 (see FIG. 7). Input 404 is coupled to connector 312 for providing the sampled RF input signal to the RF board 400. This signal is diode detected by diode 406 in order to produce output 408 which is a voltage proportional to the forward power of the RF input signal. Output 408 is routed to input 504 of control board 500 (see FIG. 7). The sampled RF input signal at input 404 is also sent to prescaler 410 which divides the frequency of that signal by 128. Prescaler 410 is preferably a Motorola MC12022A. The output of prescaler 410 is routed to MECL-to-TTL level converter 412, which provides a TTL level signal at output 414 representative of the sampled RF input frequency divided by 128. This output signal is routed to input 506 on control board 500 (see FIG. 7). Input 416 is coupled to connector 314 for providing the reflected RF signal from the dielectric resonator 204 to the RF board 400. This signal is diode detected by diode 418 in order to produce output 420 which is a voltage proportional to the reflected power of the RF input signal. Output 420 is routed to input 508 of control board 500 (see FIG. 7) for reflected power determination.

Figure 7A:
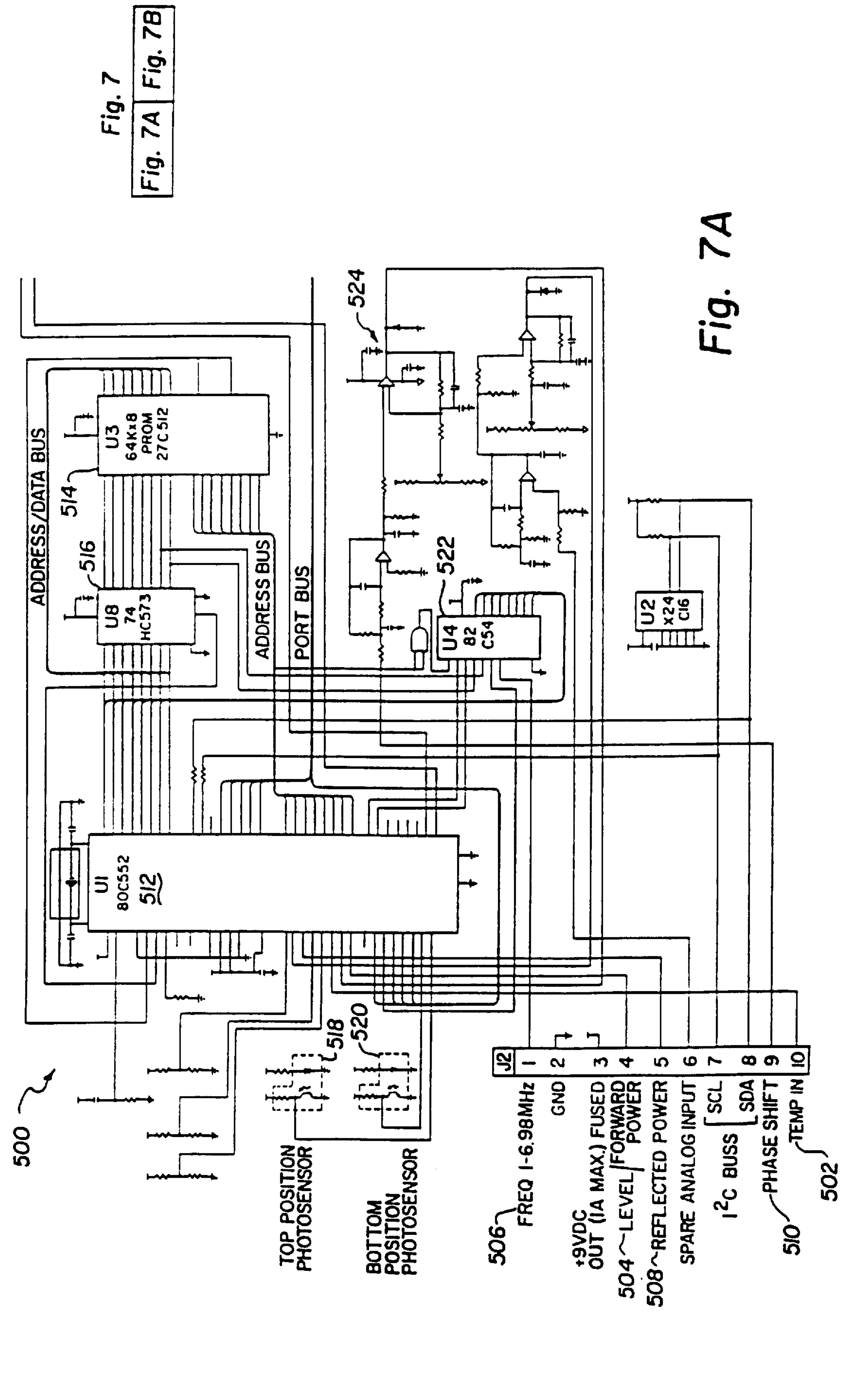
Figure 7B:
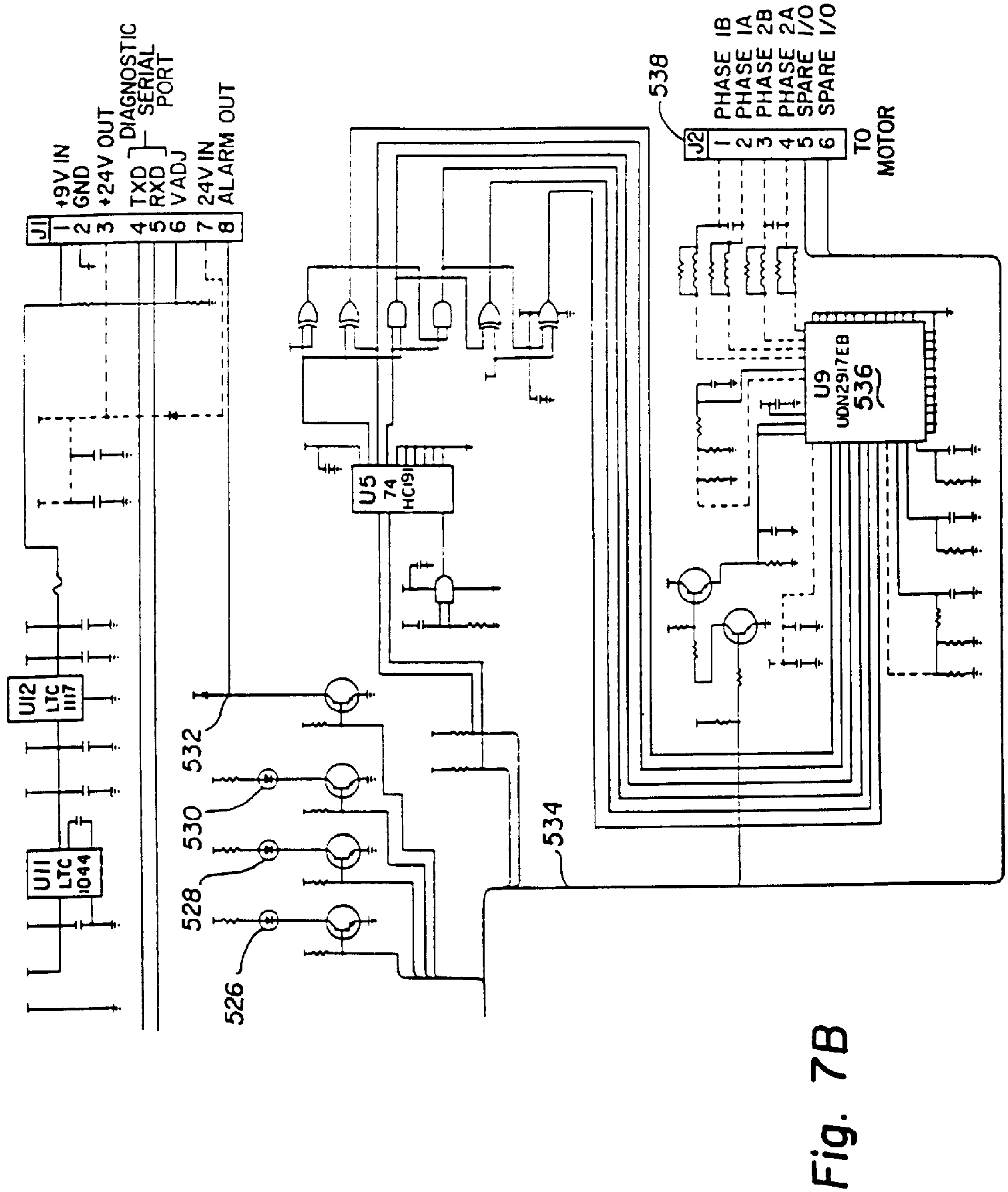

Referring now to FIG. 7, there is illustrated a schematic diagram of a first embodiment of the control board 500 of the present invention. The control board 500 includes a suitable microprocessor 512, such as an Intel 80C552. Associated with microprocessor 512 is programmable read-only memory (PROM) 514, such as an Intel 27C512 64 K×8 PROM memory chip. Address latch 516 is provided to latch addresses from microprocessor 512 to PROM 514, and is preferably a 74HC373 by Motorola. Two photocells 518 and 520 are provided in order to sense when the linear actuator 306 is at either of its extreme positions. The outputs of these photocells 518 and 520 are coupled to microprocessor 512. Input 502, which is coupled to the temperature sensor output from the RF board 400, is coupled to the input of an analog-to-digital converter that is internal to the microprocessor 512 so that the measured temperature of the dielectric resonator 204 is available to the control program executed by the microprocessor 512. The use of this temperature information will be explained in greater detail hereinbelow. Input 504, which is coupled to the diode detected forward power output 408 of RF board 400, is coupled to another analog-to-digital input on the microprocessor 512, so that the measured forward power of the dielectric resonator cavity 50 is available to the control program executed by the microprocessor 512. The use of this forward power information will be explained in greater detail hereinbelow. The prescaled frequency input 506 from output 414 on RF board 400 is coupled to timer 522 which is under the control of microprocessor 512. Timer 522 determines the prescaled frequency by counting pulses on input 506 over a predefined time period, thereby enabling the frequency of the input signal to be calculated. This information is then sent to microprocessor 512. The use of this frequency information will be explained in greater detail hereinbelow. The reflected power input 508 from output 420 of RF board 400 is also applied to an analog-to-digital converter input of microprocessor 512. The use of this reflected power information will be explained in greater detail hereinbelow. The phase shift input 510 from output 420 of RF board 400 is applied to a phase shift detect circuit 524, the output of which is applied to an analog-to-digital convertor input of microprocessor 512. The use of this phase shift information will be explained in greater detail hereinbelow.

ALARM LED 526, TUNED LED 528, MAX LED 530, as well as an external ALARM signal 532 may be activated by the microprocessor 512 via port bus 534. Linear actuator controller 536 is also controlled by microprocessor 512 via the port bus 534 and associated drive circuitry. Linear actuator controller 536 is preferably a UDN2917EB manufactured by Sonceboz. Connector 538 couples the linear actuator control signals to the linear actuator 306.

PROM 514 is used to store several important operating parameters during the use of self-tuning resonant cavity 50. Data such as the manufacturer's serial number of the unit, the date of manufacture and the date shipped may be stored before the cavity 50 is sold. Henceforth, operational data may be periodically stored in PROM 514, such as high and low temperature encountered, the number of tuning operations performed, the maximum forward RF input power encountered, the total operation time, etc. Access to this type of data is very useful for troubleshooting purposes whenever the cavity 50 is returned for repair.

Figure 8:
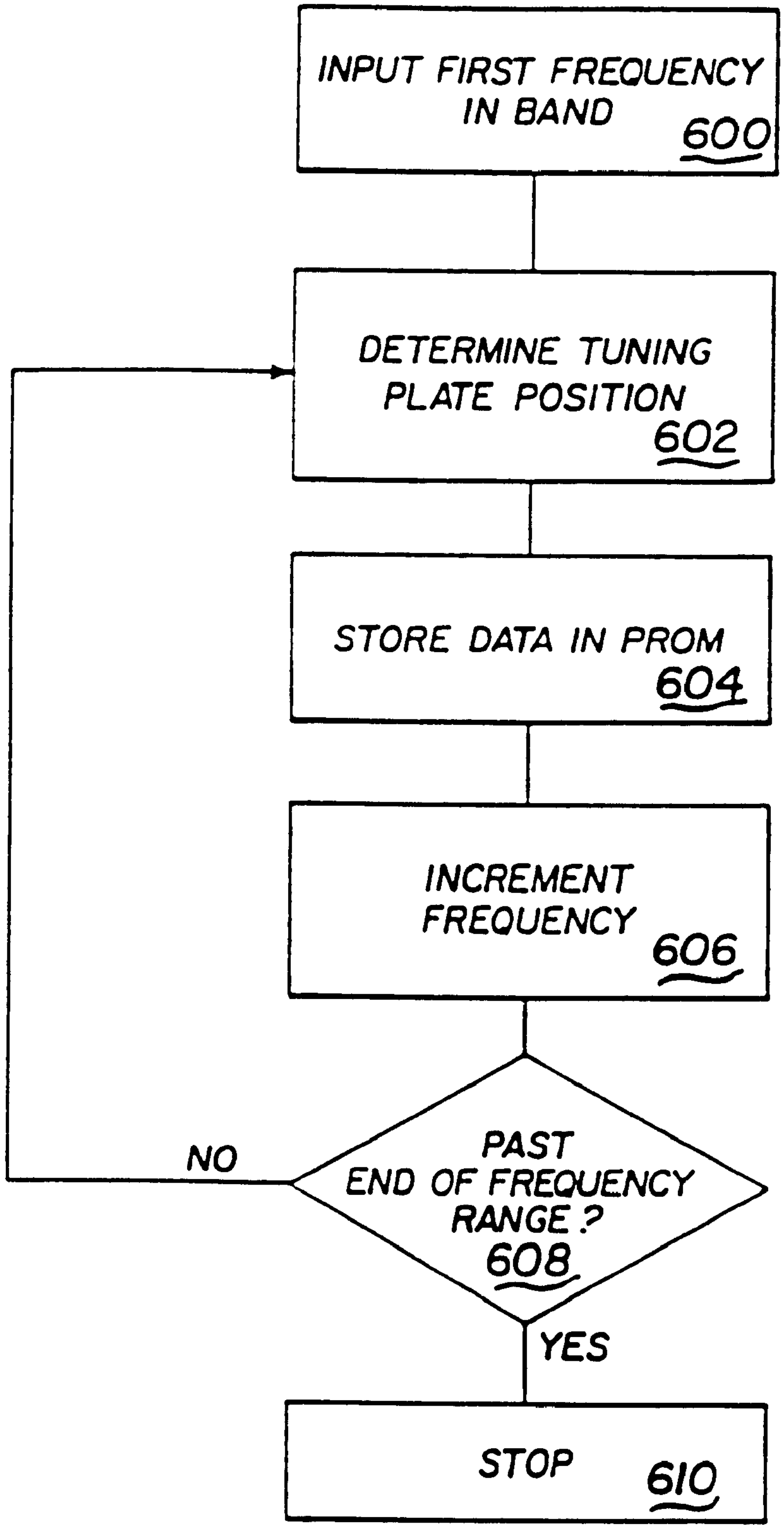
FIG. 8 is a process flow diagram of a first embodiment of a cavity characterization procedure of the present invention.

Referring now to FIG. 8, there is illustrated a cavity characterization process flow diagram of a first embodiment of the present invention. Cavity characterization is performed on each self tuning resonant cavity device 50 at the time of manufacture in order to develop a table in PROM

514 that will correlate the desired tuned frequency with an expected tuning plate 308 position. Beginning at block 600, the microprocessor 512 instructs the linear actuator 306 to move the tuning plate 308 to one end of its range, as determined by photodetector 518 (see FIG. 7), and the first frequency in the frequency band of interest is input to RF input connector 104 of the cavity 50. For cellular telephone communications, this first frequency point is 869 MHz, which represents the lower edge of the cellular frequency band. Moving the linear actuator 306 to the end of its range ensures that the step positions of the linear actuator are accurately determined during subsequent operations. Next, at block 602, the microprocessor tunes the cavity 50 to the current RF input frequency by finding the position of tuning plate 308 that produces the minimum reflected power (or alternatively, the minimum phase shift) at connector 134 (see FIG. 3A). Next, at block 604, the tuning plate 308 position for this frequency is stored into a lookup table in PROM 514. At block 606, the RF input frequency is increased by one predetermined increment (preferably approximately 500 kHz). At decision point 608, it is determined if the frequency is still within the desired tuning range. If it is, then the process returns to block 602 and the tuning plate position measurement/storage procedure is repeated for the new RF input frequency. If, however, the next frequency is outside the desired frequency range, then the entire cavity has been characterized and the process terminates at block 610.

Also stored in PROM 514 are temperature compensation factors that may be applied to the tuning plate position data in order to compensate for the effects of temperature upon the relationship between tuning plate position and frequency. This temperature compensation data is preferably not measured for each individual cavity 50, but is rather based on the average temperature effects measured for some statistically significant number of cavities 50. Application of the temperature compensation factors has the effect of changing the expected tuned location at non-ambient temperature from the expected tuned location at room temperature of tuning plate 308 for any given RF input frequency.

Figure 9:
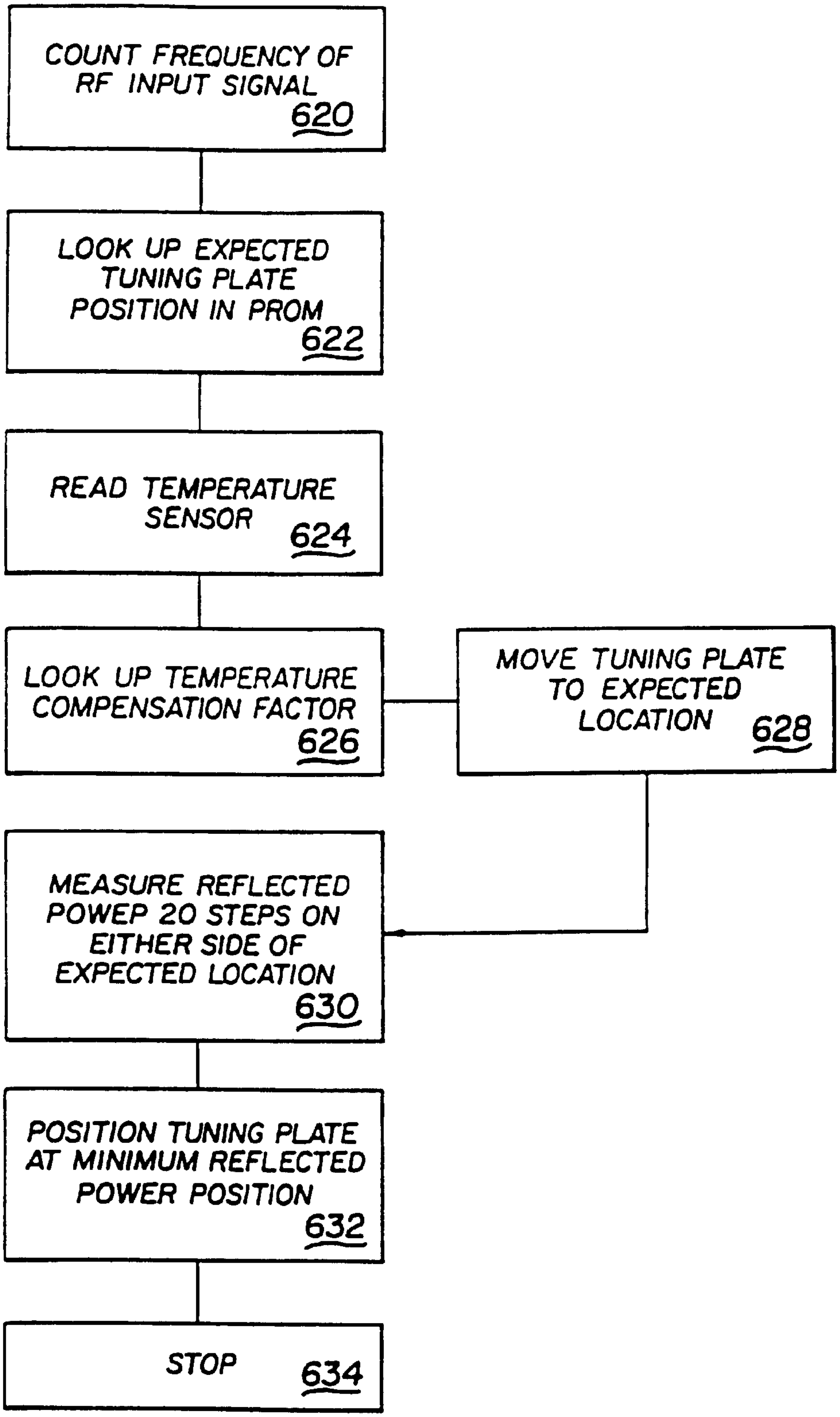
FIG. 9 is a process flow diagram of a first embodiment of a tuning procedure of the present invention.

Referring now to FIG. 9, there is illustrated a tuning procedure process flow diagram of a first embodiment of the present invention. Microprocessor 512 executes this procedure in order to tune the cavity 50 when a new input RF signal is received. Starting at block 620, the process counts the frequency of the input RF signal in order to determine what frequency to tune the cavity 50. The frequency measurement procedure of block 620 is as described hereinabove with reference to FIGS. 6 and 7. Next, at block 622, the lookup table stored in PROM 514 during the cavity characterization procedure described hereinabove with reference to FIG. 8 is accessed. The lookup table is indexed using the frequency measured in block 620 and the expected tuned position of tuning plate 308 is returned. This is the expected position of tuning plate 308 that will tune the cavity 50 to the same frequency as the RF input signal. If the measured RF input frequency is between frequency data points recorded during the cavity characterization procedure of FIG. 8, then a data interpolation is performed in order to find the expected tuning plate 308 position to the nearest linear actuator 306 step position. A reading is taken from temperature sensor 60 (see FIG. 6) at block 624 and this reading is used to access any appropriate temperature compensation factor from PROM 514 at block 626. At block 628, the tuning plate 308 is moved to the expected location indicated by the value returned by the lookup table in PROM 514. Because of numerous factors which may interfere with the accuracy of the PROM 514 data over long periods of use of the cavity 50, the cavity tune is physically measured at block 630 over a range of twenty linear actuator 306 steps on either side of the expected tuned location of tuning plate 308. The microprocessor 512 measures the reflected power (or, alternatively, the phase shift) from the RF input at each step position within this range in order to find the step position which produces the minimum reflected RF power (or phase shift). This is the precise tuned position of the cavity 50 for the current RF input frequency. At block 632, the tuning plate 308 is moved to this position and the cavity 50 is tuned. The process therefore terminates at block 634.

If, at block 630, it is determined that the minimum reflected input power occurs at a position other than the expected position of tuning plate 308, then the microprocessor 512 may update the lookup table in PROM 514 so that this position now becomes the expected tuning plate 308 position in the future. In this way, the first embodiment of the present invention is able to automatically compensate for wear in the mechanical components of the system. Furthermore, the input power to the cavity 50 may range from 50 milliwatts up to 50 Watts, for example. At low power (below 5 Watts, for example), the control system may not be able to detect a reflected power from the input of the cavity 50. In such situations, the tuning plate 308 is moved to the expected location as indicated by the lookup table in PROM 514 and this position is not subsequently adjusted.

Figure 10:
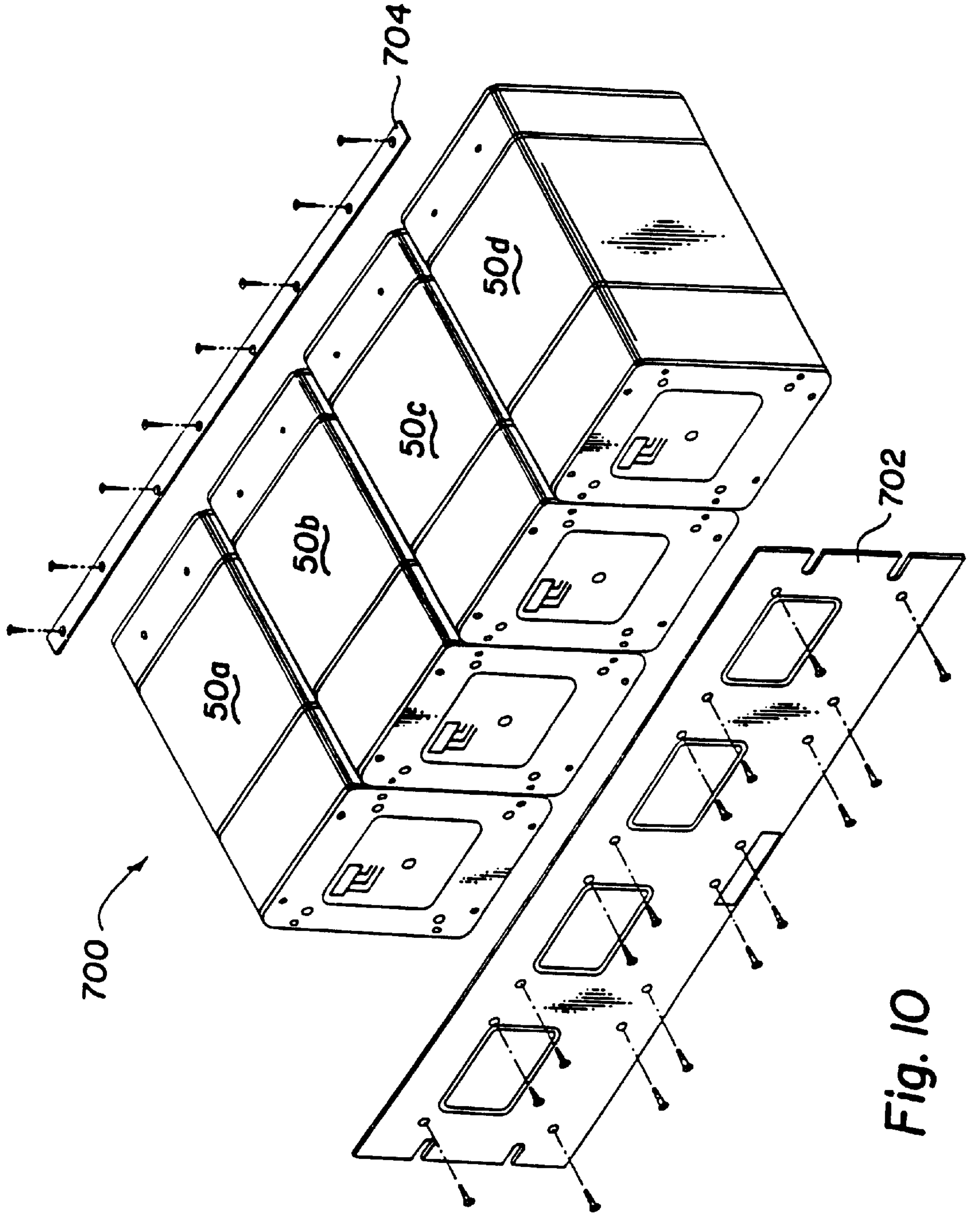
FIG. 10 is an exploded isometric view of a first embodiment of a self-tuning resonant cavity bank of the present invention.

Referring now to FIG. 10, there is illustrated a first embodiment self-tuning resonant cavity bank of the present invention, indicated generally at 700. Bank 700 is comprised of several cavities 50 coupled together. FIG. 10 shows four such cavities 50*a*, 50*b*, 50*c* and 50*d*. Four cavities 50 have been shown for illustrative purposes only, and any number of cavities 50 may be combined into a single bank. The cavities 50*a–d* may be conveniently mechanically coupled by means of face plate 702 and strip 704.

Figure 11:
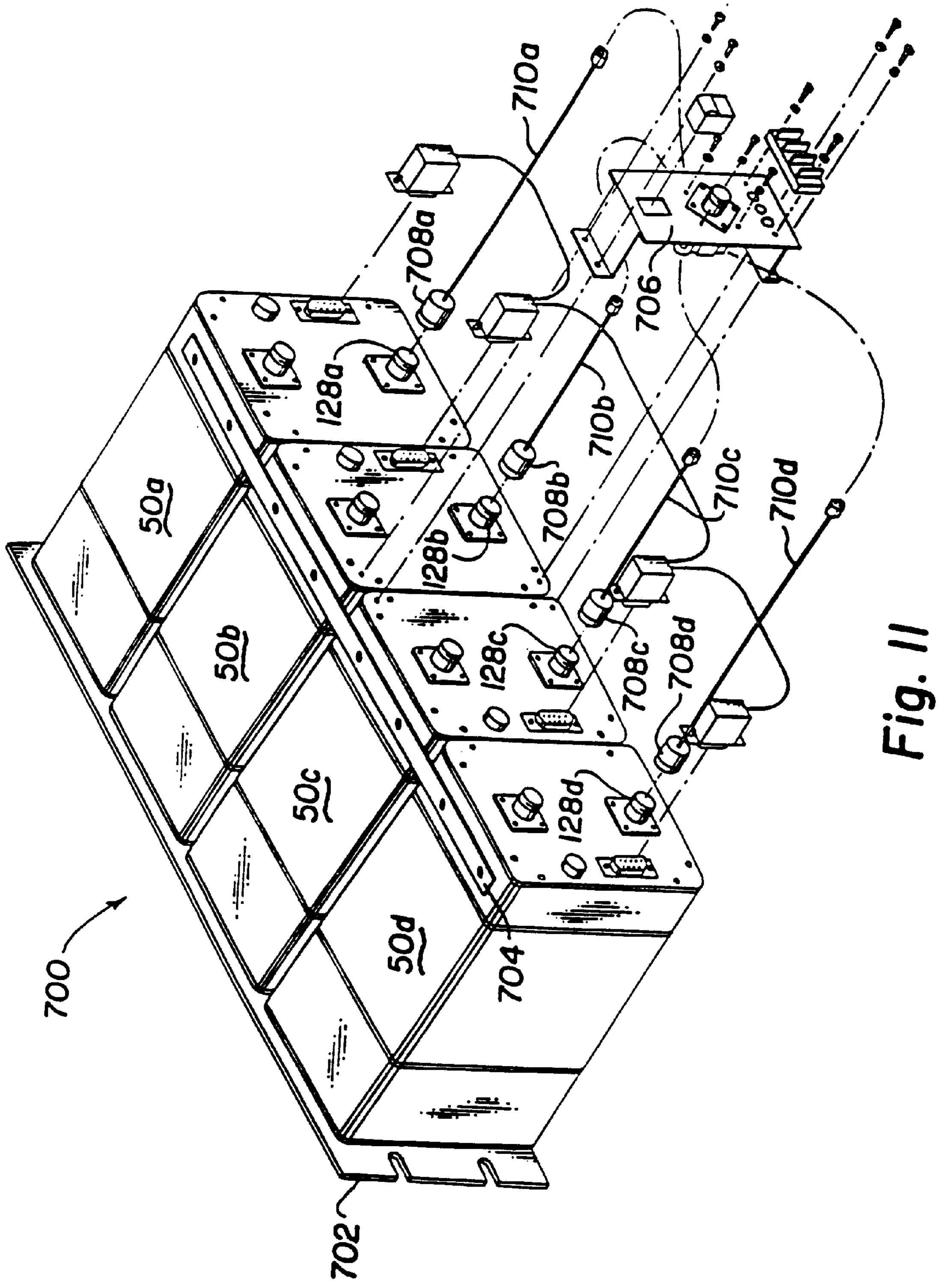
FIG. 11 is an exploded isometric view of a first embodiment of a combiner network for use with the first embodiment cavity bank of FIG. 10.

Referring now to FIG. 11, there is illustrated a first embodiment combiner network for use in forming the bank 700 of FIG. 10. Combiner network 706 is a star network which allows several cavities 50*a–d* to couple their respective RF outputs 128*a–d* to a single output antenna (not shown). Coupling is accomplished by means of APC-7 connectors 708*a–d* and coaxial cables 710*a–d*. Cost and space efficiency is achieved by using several cavities 50 in a bank 700 coupled to a single antenna.

Figure 12:
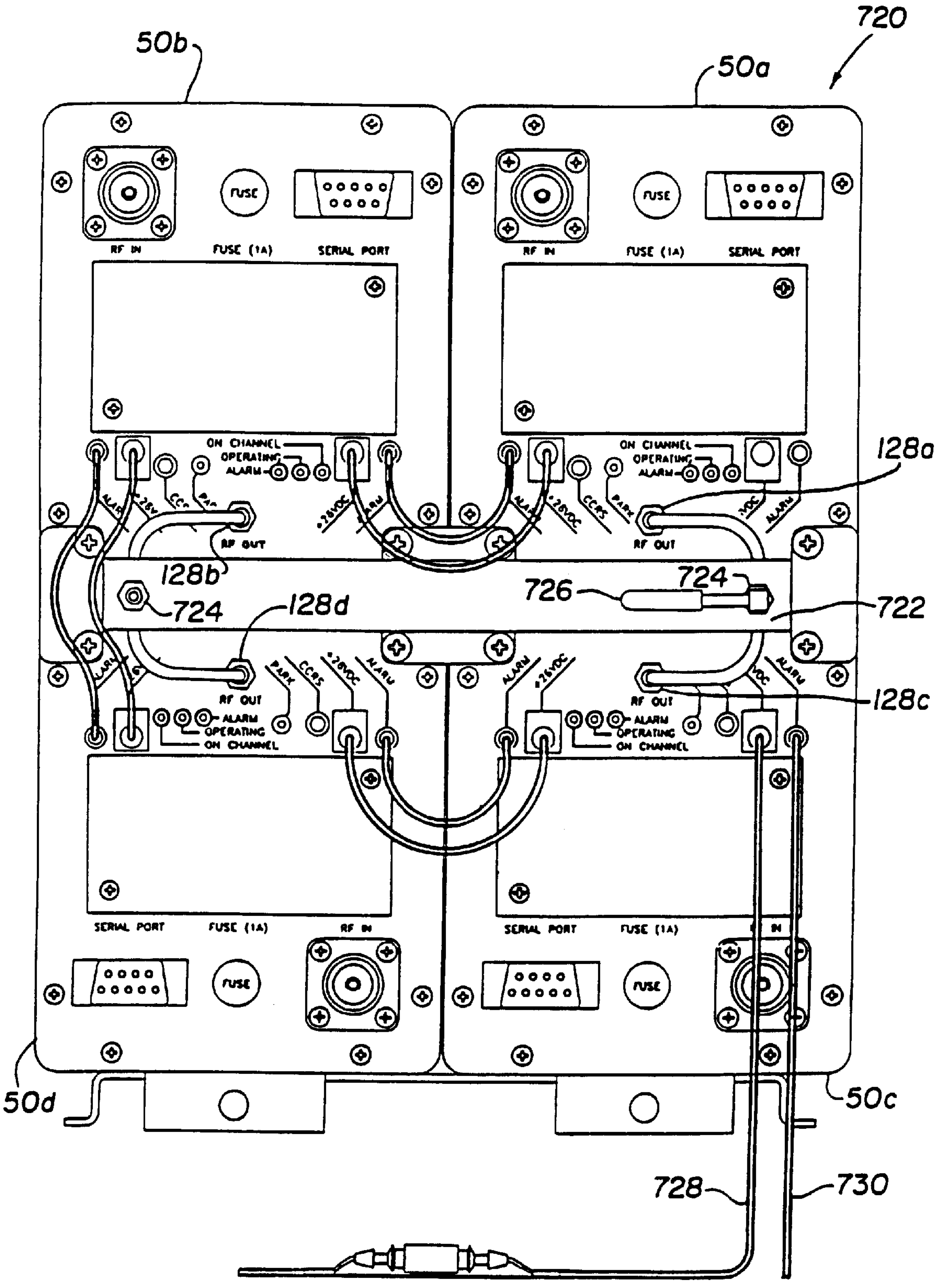
FIG. 12 is the rear view of a second embodiment of a self tuning resonant cavity bank of the present invention.

Referring now to FIG. 12, there is illustrated a second embodiment self tuning resonant cavity bank of the present invention, indicated generally at 720. The second embodiment is substantially equivalent to the first embodiment of FIG. 10, however the four resonant cavities 50*a–d* are arranged in a grid of four such that all four RF outputs 128*a–d* are adjacent the center of the grid. This allows for a short connection between each RF output 128*a–d* and an output bus 722. The output bus 722 has an RF coupling 724 on each end to facilitate daisy chaining of similar output busses 722. One of the RF couplings 724 is shown with an RF termination 726 coupled thereto. Such a termination 726 is required if no other connection is to be made to any RF coupling 724 in order to eliminate reflections, as is known in the art. Various other signals may be daisy chained between the cavities 50*a–d,* such as DC power supply lines 728 and alarm line 730.

Figure 13:
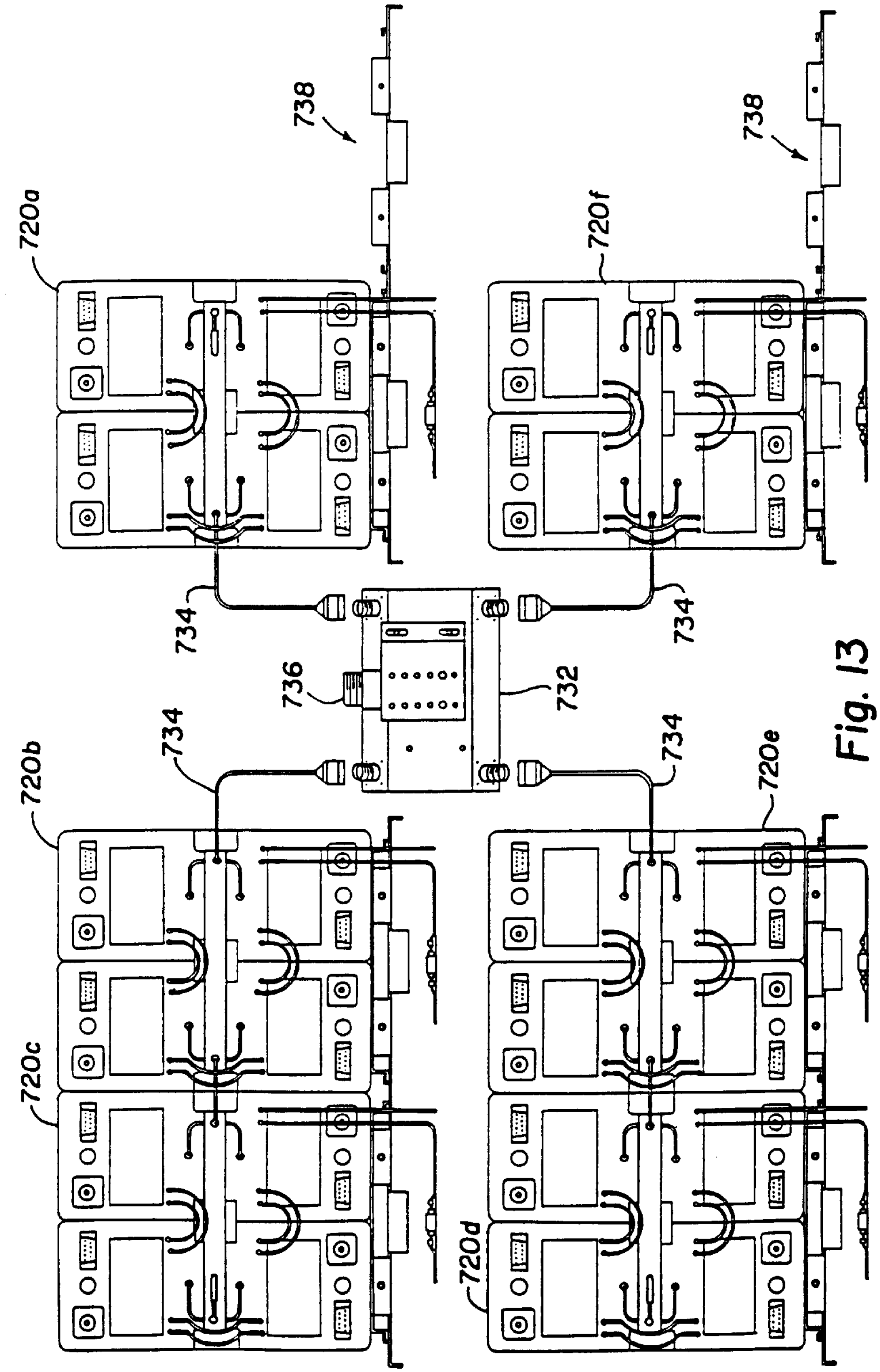
FIG. 13 is the rear view of multiple cavity banks of the present invention connect to a combiner network.

Referring now to FIG. 13, several cavity banks 720 are shown ganged together for connection to a single output antenna (not shown). For example, cavity banks 720*b* and 720*c* have their output busses 722 ganged together by interconnection of respective RF couplings 724. The output of this combined output bus is coupled to a combiner network 732 via RF cables 734. The other cavity banks shown are similarly coupled to combiner 732. All of these output signals (24 frequencies from 24 different cavities) are combined and coupled to a single output antenna (not shown) through coupling 736. Expansion slots 738 are shown for incorporation of additional cavity banks 720 if required in the future.

Although preferred embodiments of the present invention have been described in the foregoing Detailed Description and illustrated in the accompanying drawings, it will be understood that the invention is not limited to the embodiments disclosed, but is capable of numerous rearrangements, modifications, and substitutions of parts and elements without departing from the spirit of the invention. Accordingly, the present invention is intended to encompass such rearrangements, modifications, and substitutions of parts and elements as fall within the scope of the appended claims.

What is claimed is:

1. A method for characterizing a frequency response of a resonant cavity filter comprising a cavity, a dielectric resonator disposed in the cavity, and a tuning element moveable within the cavity relative to the dielectric resonator, the method comprising the steps of:

(a) inputting an input signal having a first frequency to the resonant cavity filter;

(b) moving the tuning element relative to the dielectric resonator until the resonant cavity filter resonates at said first frequency;

(c) storing information in electronic memory representing a position of movement of the tuning element relative to the dielectric resonator corresponding to the first frequency; and (d) repeating steps (a), (b) and (c) for a plurality of frequencies across a range of frequencies for which it is desired to know the frequency response of the resonant cavity filter.

2. The method of claim 1 wherein said electronic memory is electrically erasable programmable read-only memory.

3. The method of claim 1 wherein the resonance at which said resonant cavity filter resonates in step (b) is determined by minimizing one of (1) a phase shift of a reflection of said input signal and (2) a power of a reflection of said input signal.

4. A method of tuning a resonant cavity filter within a range of frequencies, the resonant cavity filter having a cavity and a tuning element movable within said cavity, the method comprising the steps of:

(a) inputting an input signal within said range of frequencies to an input of said resonant cavity filter;

(b) providing in memory information representing a plurality of frequencies across said range of frequencies and representing expected positions of movement of said tuning element corresponding to said plurality of frequencies;

(c) determining a frequency of said input signal with frequency measuring means;

(d) selecting an expected position of movement of said tuning element from said information in said memory which substantially corresponds to the frequency of said input signal; and (e) moving said tuning element to said selected expected position of movement.

5. The method of claim 4, comprising the further steps of:

(f) measuring one of (1) a phase shift of a reflection of said input signal and (2) a power of a reflection of said input signal;

(g) repeating step (f) at a predetermined number of tuning element locations near said selected expected position of movement; and (h) moving said tuning element to one of said tuning element locations at which said one of said phase shift and power of said reflection of said input signal is a minimum.

6. The method of claim 5, comprising the further step of updating said information in said memory to correspond with said one tuning element location at which said one of said phase shift and power of said reflection of said input signal is a minimum.

7. The method of claim 4, comprising the further steps of:

(f) measuring a power of said input signal;

(g) determining if said measured power is above a minimum threshold; and (h) if said measured power is above a minimum threshold, fine tuning said filter by measuring one of (1) a phase shift of a reflection of said input signal and (2) a power of a reflection of said input signal when said tuning element is at a plurality of predetermined locations near said selected expected position of movement and then moving said tuning element to one of said tuning element-locations at which said one of said phase shift and power of said reflection of said input signal is a minimum.

8. The method of claim 4, wherein said information in said memory comprises a lookup table including a plurality of datapoints, the method comprising the further step of ascertaining if said determined frequency is between a pair of datapoints in said lookup table, and if it is, then selecting an expected position of movement of said tuning element by interpolating between said pair of datapoints and then moving said tuning element to said selected expected position of movement.

9. A resonant cavity filter comprising a cavity and a dielectric resonator disposed in said cavity;

said filter having an input port for receiving an input signal, frequency measuring means for measuring a frequency of the input signal, and an output port, said filter being adapted to produce an output signal at said output port;

a tuning element movable within said cavity;

said filter further comprising memory means for storing position information representing a plurality of frequencies across a selected range of frequencies of expected input signals and corresponding expected positions of movement of said tuning element within said cavity which will produce resonance, and control means for selecting from said memory means an expected position of movement of said tuning element which substantially corresponds to the measured frequency of said input signal and for moving said tuning element to said selected expected position of movement.

10. The resonant cavity filter of claim 9 wherein said control means is further operable to fine tune said resonant cavity filter by measuring one of (1) a phase shift of a reflection of said input signal and (2) a power of a reflection of said input signal when said tuning element is at a plurality of predetermined locations near said selected expected position of movement and to move said tuning element to one of said tuning element locations at which said one of said phase shift and power of said reflection of said input signal is a minimum.

11. The resonant cavity filter of claim 10, wherein said control means is further adapted for updating said position information in said memory means to correspond with said one tuning element location at which said one of said phase shift and power of said reflection of said input signal is a minimum.

12. The resonant cavity filter of claim 9 further comprising power measuring means for measuring a power of said input signal, wherein said control means is further adapted for determining if said measured power is above a minimum threshold and if said measured power is above a minimum threshold, then fine tuning said resonant cavity filter by measuring one of (1) a phase shift of a reflection of said input signal and (2) a power of a reflection of said input signal when said tuning element is at a plurality of predetermined locations near said selected expected position of movement and moving said tuning element to one of said tuning element locations at which said one of said phase shift and power of said reflection of said input signal is a minimum.

13. The resonant cavity filter of claim 9, wherein said position information further comprises a lookup table including a plurality of datapoints and said control means is further adapted to interpolate a selected expected position of movement of said tuning element if said measured frequency is between a pair of datapoints in said lookup table.

14. A combiner network comprising a plurality of resonant cavity filters, each said resonant cavity filter comprising a cavity and a dielectric resonator disposed in said cavity;

each said filter having an input port for receiving an input signal, frequency measuring means for measuring a frequency of the input signal, and an output port, each said filter being adapted to produce an output signal at said output port;

a tuning element movable within said cavity;

each said filter further comprising memory means for storing position information representing a plurality of frequencies across a selected range of frequencies of expected input signals and corresponding expected positions of movement of said tuning element within said cavity which will produce resonance and control means for selecting from said memory means an expected position of movement of said tuning element which substantially corresponds to the measured frequency of said input signal and for moving said tuning element to said selected expected position of movement.

15. The combiner network of claim 14 wherein said control means is further operable to fine tune said resonant cavity filter by measuring one of (1) a phase shift of a reflection of said input signal and (2) a power of a reflection of said input signal when said tuning element is at a plurality of predetermined locations near said selected expected position of movement and to move said tuning element to one of said tuning element locations at which said one of said phase shift and power of said reflection of said input signal is a minimum.

16. The combiner network of claim 14 wherein said control means comprises a first controller for selecting from said memory means an expected position of movement of said tuning element which substantially corresponds to the measured frequency of said input signal and a second controller for moving said tuning element to said selected expected position of movement, said first controller being common to all of said resonant cavity filters and individual second controller for each resonant cavity filter.

17. The combiner network of claim 14 wherein each said resonant cavity filter comprises a modular, self-tuning resonant cavity filter and wherein each said modular, self-tuning resonant cavity filter is tunable to a different input signal frequency.

* * * * *